(12) United States Patent
Takahashi

(10) Patent No.: US 9,065,393 B2
(45) Date of Patent: Jun. 23, 2015

(54) POWER AMPLIFIER, RADIO-FREQUENCY POWER AMPLIFICATION DEVICE, AND AMPLIFICATION CONTROL METHOD

(75) Inventor: Kiyohiko Takahashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 104 days.

(21) Appl. No.: 13/824,458

(22) PCT Filed: Sep. 26, 2011

(86) PCT No.: PCT/JP2011/072687
§ 371 (c)(1),
(2), (4) Date: Mar. 18, 2013

(87) PCT Pub. No.: WO2012/046668
PCT Pub. Date: Apr. 12, 2012

(65) Prior Publication Data
US 2013/0194037 A1 Aug. 1, 2013

(30) Foreign Application Priority Data
Oct. 5, 2010 (JP) .................................. 2010-225567

(51) Int. Cl.
| | |
|---|---|
| *H03F 3/21* | (2006.01) |
| *H03F 1/32* | (2006.01) |
| *H03F 3/217* | (2006.01) |
| *H03F 3/24* | (2006.01) |
| *H03F 1/02* | (2006.01) |
| *H03F 3/195* | (2006.01) |

(52) U.S. Cl.
CPC ............... *H03F 3/211* (2013.01); *H03F 1/32* (2013.01); *H03F 3/217* (2013.01); *H03F 3/245* (2013.01); *H03F 2200/462* (2013.01); *H03F 2200/481* (2013.01); *H03F 2200/555* (2013.01); *H03F 1/0222* (2013.01); *H03F 3/195* (2013.01)

(58) Field of Classification Search
CPC .... H03F 1/0211; H03F 1/0216; H03F 1/0222
USPC .................................................. 330/10, 136
See application file for complete search history.

(56) References Cited

U.S. PATENT DOCUMENTS 7,696,818 B2 * 4/2010 Kunihiro et al. ............... 330/10

FOREIGN PATENT DOCUMENTS

| JP | S6339216 A | 2/1988 |
|---|---|---|
| JP | 2003500873 A | 1/2003 |
| JP | 2003243994 A | 8/2003 |
| JP | 2007215158 A | 8/2007 |
| JP | 2009100197 A | 5/2009 |
| JP | 2010213227 A | 9/2010 |
| WO | 2010089971 A1 | 8/2010 |

OTHER PUBLICATIONS

The international search report for PCT/JP2011/072687 mailed on Nov. 8, 2011.
English translation of the international write opinion for PCT/JP2011/072687.
Donald F. Kimbal, Jinho Jeong, Chin Hsia, Paul Draxler, Sandro Lanfranco, Walter Nagy, Kevin Linthicum, Lawrence E. Larson, Peter M.Asbeck, "High-Efficiency Envelope-Tracking W-CDMA Base-Station Amplifier Using GaN HFETs", IEEE Transactions on Microwave Theory and Techniques, vol. 54, No. 11, Nov. 2006, pp. 3848 to 3856.

* cited by examiner

*Primary Examiner* — Steven J Mottola
(74) *Attorney, Agent, or Firm* — Sughrue Mion, PLLC

(57) ABSTRACT

The present invention allows amplification with low distortion and high efficiency.
A power amplifier of the present invention comprises signal conversion means which generates a digital signal and an analog signal from an input signal that is an amplification target based on a signal generation parameter, a switching amplifier which amplifies the digital signal, a linear amplifier which amplifies the analog signal, and DC level detection means which detect a DC level of at least one of the signal amplified by the linear amplifier and the amplified signal and output a detection result to the signal conversion means, wherein the signal conversion means adjust the signal generation parameter so that the DC level inputted by the DC level detection means is virtually equal to zero.

16 Claims, 11 Drawing Sheets

POWER AMPLIFIER, RADIO-FREQUENCY POWER AMPLIFICATION DEVICE, AND AMPLIFICATION CONTROL METHOD

This application is a National Stage Entry of PCT/JP2011/072687 filed Sep. 26, 2011, which claims priority from Japanese Patent Application 2010-225567 filed A Oct. 5, 2010, the contents of all of which are incorporated herein by reference, in their entirety.

TECHNICAL FIELD

The present invention relates to a power amplifier, a radio-frequency power amplification device, and an amplification control method.

BACKGROUND ART

A modulation scheme used for wireless communication devices such as a modern mobile phone and the like has radio-frequency utilization efficiency and a high peak-to-average power ratio (PAPR). In order to amplify a signal to which an amplitude modulation is applied by using an AB class amplifier that has been commonly used in a wireless communication field, it is necessary to use an amplifier operating with sufficient back-off to maintain a linearity. Generally, the required back-off value is at least approximately equal to a value of the PAPR. However, in the AB class amplifier, the maximum efficiency is obtained when it operates at the saturation point and the efficiency of the amplifier decreases with increasing the back-off value. Therefore, it is difficult to improve the power efficiency of the power amplifier for amplifying the radio-frequency modulation signal having a high PAPR.

As a power amplifier for amplifying a modulation signal having a high PAPR with high efficiency, a polar modulation power amplifier is used. In the polar modulation power amplifier, the radio-frequency modulation signal used for wireless communication is generated from the polar coordinate components of amplitude and phase. FIG. 15 is a configuration diagram of a polar modulation power amplifier described in non-patent document 1. The amplifier comprises a radio-frequency modulation signal input terminal 101, an amplitude signal input terminal 102, a power supply modulator 103, a radio-frequency power amplifier 104, and a radio-frequency modulation signal output terminal 105. The power supply modulator 103 comprises a linear amplifier 106, a subtractor 107, a current sensing resistor 108, a hysteresis comparator 109, a switching amplifier 110, an inductor 111, and an electric power supply terminal 112.

The radio-frequency modulation signal that is amplitude-modulated or phase-modulated is inputted through the radio-frequency modulation signal input terminal 101 and outputted to the radio-frequency power amplifier 104. An amplitude signal in the radio-frequency modulation signal inputted through the radio-frequency modulation signal input terminal 101 is inputted from the amplitude signal modulation terminal 102. The signal inputted through the amplitude signal modulation terminal 102 is highly efficiently amplified by the power supply modulator 103 and supplied to the radio-frequency power amplifier 104 through the electric power supply terminal 112 as a power supply. The radio-frequency power amplifier 104 amplifies the signal inputted through the radio-frequency modulation signal input terminal 101 and outputs the amplified signal to the radio-frequency modulation signal output terminal 105.

To amplify the input signal with high efficiency and low distortion, the power supply modulator 103 has a configuration in which both the switching amplifier 106 and the operational amplifier 110 are disposed. The amplitude signal inputted through the amplitude signal modulation terminal 102 is inputted to the linear amplifier 106.

The output impedance of the linear amplifier 106 is low. The linear amplifier 106 linearly amplifies the inputted signal and outputs the amplified signal. The signal outputted by the linear amplifier 106 is transmitted to the electric power supply terminal 112 through the current sensing resistor 108.

The subtractor 107 is connected to both ends of the current sensing resistor 108 and outputs a value obtained by subtracting a voltage of the electric power supply terminal 112 from a voltage of the output signal of the linear amplifier 106. Here, because the input impedance of the subtractor 107 is high, the subtractor 107 does not consume a large amount of electric power supplied to the output signal of the linear amplifier 106 and the electric power supply terminal 112.

Further, because the impedance of the current sensing resistor 108 is set to low, the voltage across both ends of the current sensing resistor 108 is negligibly small compared to the voltage on the electric power supply terminal 112.

The output signal of the subtractor 107 is inputted to the hysteresis comparator 109. The hysteresis comparator 109 makes a sign determination of the input signal and outputs a result to the switching amplifier 110. However, the hysteresis comparator 109 has a function to hold the latest output state and has a hysteresis width (V_hys), when the latest output state is "Low", the output state changes to "High" when the input signal level becomes equal to or greater than V_hys/2 and when the latest output state is "High", the output state changes to "Low" when the input signal level becomes equal to or smaller than –V_hys/2.

The signal inputted to the switching amplifier 110 is amplified and outputted to the electric power supply terminal 112 through the inductor 111. In this operation, a current supplied by the switching amplifier 110 through the inductor 111 is combined with a current supplied by the linear amplifier 106 through the current sensing resistor 108, and the current is sent to the electric power supply terminal 112.

The above-mentioned power supply modulator 103 has two advantages: high linearity of the linear amplifier 106 and high efficiency of the switching amplifier 110. This is because in the power supply modulator 103, the output voltage is determined by the linear amplifier 106 having low output impedance and most of the output current is supplied by the switching amplifier 110 with high efficiency. The current outputted through the electric power supply terminal 112 is a sum of the output current of the linear amplifier 106 and the output current of the switching amplifier 110. An electric potential of the electric power supply terminal 112 depends on the electric potential of the linear amplifier 106 having low output impedance. In order to maintain the electric potential of the electric power supply terminal 112 to a target value, the current is supplied by the linear amplifier 106. The output current of the linear amplifier 106 is detected by using the current sensing resistor 108 and the hysteresis comparator 109 and the current supplied by the switching amplifier 110 is adjusted so that the output current of the linear amplifier 106 is prevented from becoming excessive. By using the above-mentioned method, most of the current outputted through the electric power supply terminal 112 is supplied by the switching amplifier 110 and the output current of the linear amplifier 106 can be used only for correction of an error component of the switching amplifier 110.

Additionally, as with non-patent document 1 shown in FIG. 15, an example using the power supply modulator in which the switching amplifier and the linear amplifier are operated together is described in patent document 1.

FIG. 16 is a configuration diagram of a radio-frequency power amplifier described in patent document 1. The radio-frequency power amplifier comprises a radio-frequency modulation signal input terminal 201, an envelope detector 202, a limiter 203, a power supply modulator 204, a radio-frequency power amplifier 205, and a radio-frequency modulation signal output terminal 206. Further, the power supply modulator 204 comprises a delta modulator 207, a switching amplifier 208, a low pass filter 209, an operational amplifier 210, an attenuator 211, an adder 212, and an electric power supply terminal 213.

The radio-frequency modulation signal that is amplitude-modulated or phase-modulated is inputted through the radio-frequency modulation signal input terminal 201 and sent to the envelope detector 202 and the limiter 203. The envelope detector 202 extracts only the amplitude modulation component from the inputted radio-frequency modulation signal and outputs the extracted amplitude modulation component to the power supply modulator 204. The power supply modulator 204 amplifies the signal inputted by the envelope detector 202 with high efficiency and supplies the amplified signal through the electric power supply terminal 213 as a power supply for the radio-frequency power amplifier 205. The limiter 203 eliminates the amplitude modulation component from the signal inputted through the radio-frequency modulation signal input terminal 201 and outputs the limited signal to the radio-frequency power amplifier 205. The radio-frequency power amplifier 205 amplifies a signal obtained by multiplying the signal inputted by the limiter 203 by the signal supplied through the electric power supply terminal 213, and outputs the amplified signal through the radio-frequency modulation signal output terminal 206.

To amplify the input signal with high efficiency and low distortion, the power supply modulator 204 has a configuration in which both the switching amplifier 208 and the operational amplifier 210 are disposed like the power supply modulator 103 shown in FIG. 15. The signal outputted by the envelope detector 202 is inputted to the delta modulator 207 and the operational amplifier 210. The delta modulator 207 creates a 1-bit signal based on the signal inputted by the envelope detector 202 and the feedback signal from the output of the switching amplifier 208, and outputs the 1-bit signal to the switching amplifier 208. The switching amplifier 208 amplifies the signal inputted by the delta modulator 207, outputs the amplified signal to the low pass filter 209, and also returns the amplified signal to the delta modulator 207 as the feedback signal. The low pass filter 209 eliminates high-frequency noise from the signal inputted by the switching amplifier 208 and outputs the filtered signal to the adder 212. On the other hand, the operational amplifier 210 amplifies a signal obtained by subtracting the signal inputted through the attenuator 211 from the signal inputted by the envelope detector 202 and outputs the amplified signal to the adder 212.

The adder 212 adds the output signal of the low pass filter 209 to the output signal of the operational amplifier 210 and outputs the added signal to the attenuator 211 and the electric power supply terminal 213. The attenuator 211 attenuates the output signal of the adder 212 and outputs the attenuated signal to the operational amplifier 210.

In the power supply modulator 204 shown in FIG. 16, the operational amplifier 210 corrects the error component of the switching amplifier 208 like the power supply modulator 103 shown in FIG. 15. Therefore, the power consumption of the operational amplifier 210 is low and most of the electric power supplied to the radio-frequency power amplifier 205 through the electric power supply terminal 213 is supplied by the switching amplifier 208.

Further, the power supply modulator 103 disclosed in non-patent document 1 and the power supply modulator 204 described in patent document 1 can be used as a stand-alone power amplifier. For example, it can be used as a power amplifier for driving a motor.

THE PRECEDING TECHNICAL LITERATURE

Patent Document

[Patent Document 1] Japanese Patent Application Laid-Open No. 2007-215158

Non-patent Document

[Non-Patent Document 1] Donald F. Kimbal, Jinho Jeong, Chin Hsia, Paul Draxler, Sandro Lanfranco, Walter Nagy, Kevin Linthicum, Lawrence E. Larson, Peter M. Asbeck, "High-Efficiency Envelope-Tracking W-CDMA Base-Station Amplifier Using GaN HFETs", IEEE TRANSACTIONS ON MICROWAVE THEORY AND TECHNIQUES, VOL. 54, NO. 11, NOVEMBER 2006, pp. 3848 to 3856

SUMMARY OF INVENTION

Technical Problem

However, each of the power supply modulators disclosed in non-patent document 1 and patent document 1 has a problem.

The power supply modulator 103 described in non-patent document 1 has a problem in which the efficiency of the power supply modulator 103 decrease when amplifying a high-speed signal. When the operation delay occurs in a path in which the output current of the linear amplifier 106 is detected by the subtractor 107 and it is amplified by the switching amplifier 110 through the hysteresis comparator 109, the following problem may occur. Namely, there is a possibility that the operation of the switching amplifier 110 can not follow the operation of the linear amplifier 106. For this reason, when amplifying the high-speed signal, the linear amplifier 106 operates so as to correct the operation delay of the switching amplifier 110. As a result, the output power of the linear amplifier 106 with low efficiency increases and the efficiency of the whole power supply modulator 103 decreases.

On the other hand, the power supply modulator 204 described in patent document 1 has a problem in which the efficiency of the power supply modulator 204 decreases when the switching amplifier 208 and the operational amplifier 210 have a gain error. When an operation delay amount of the switching amplifier 208 is different from that of the operational amplifier 210 or there is an error between a sum of the gains of the delta modulator 207 and the switching amplifier 208 and the gain of the operational amplifier 210, this decrease in efficiency occurs. Such error inevitably theoretically occurs because both the switching amplifier 207 and the operational amplifier 210 are feedback amplifiers. Here, both the switching amplifier 208 and the operational amplifier 210 operate as a voltage source. When the voltage source determines the output voltage, the current required to generate the voltage to be outputted flows from the voltage source. An amount of current outputted by an ideal voltage source is not limited. Namely, it can supply an infinite amount of current. When a voltage of one node is set by two ideal voltage sources which have different output voltages, each of two ideal voltage sources operates so as to set the voltage of the node to a voltage determined by its own output voltage by supplying the infinite amount of current. In an actual circuit, each of two voltage sources operates so as to set the voltage of the node to a voltage determined by its own output voltage by supplying a maximum amount of current that can be supplied by the voltage source. Accordingly, when the above-mentioned error occurs, there is a possibility that when the adder 212 combines the outputs of both the voltage sources, a large amount of current flows and the power loss occurs.

(Object of the Invention)

An object of the present invention is to provide a power amplifier, a radio-frequency power amplification device, and an amplification control method which can perform amplification with low distortion and high efficiency.

Solution to Problem

A power amplifier of the present invention includes a signal conversion means which generates a digital signal and an analog signal from an input signal that is an amplification target based on a signal generation parameter, a switching amplifier which amplifies said digital signal, a linear amplifier which amplifies said analog signal, and DC level detection means which detects a DC level of at least one of a signal which has been amplified or intended to be amplified by said linear amplifier, and outputs a detection result to said signal conversion unit, wherein said signal conversion means adjusts said signal generation parameter so that said DC level inputted by said DC level detection unit is virtually equal to zero.

In another aspect of the present invention, a power amplifier includes a signal distribution means which divides an input signal that is an amplification target into a first signal and a second signal, a switching amplifier module which generates a digital signal from said first signal and amplifies said digital signal, a linear amplifier module which amplifies said second signal, detects DC level of at least one of the signal which has been amplified or intended to be amplified, and outputs a detection result to said switching amplifier module as DC level information, and a signal output terminal outputs a signal which is the signal amplified by said switching amplifier module combined with the signal amplified by said linear amplifier module, wherein said switching amplifier module adjusts a signal generation parameter related to generation of said digital signal so that said DC level is virtually equal to zero.

A radio-frequency power amplifier of the present invention includes a baseband signal conversion circuit which generates a radio-frequency modulation signal and an amplitude modulation signal, a radio-frequency power amplifier which amplifies said radio-frequency modulation signal, and a power supply modulator which inputs said amplitude modulation signal as an input signal and supplies an output signal as a power supply for said radio-frequency power amplifier, wherein said power supply modulator comprises signal conversion means which generate a digital signal and an analog signal from the input signal that is an amplification target based on a signal generation parameter, a switching amplifier which amplifies said digital signal, a linear amplifier which amplifies said analog signal, and DC level detection means which detects DC level of at least one of a signal which is amplified or has been amplified by said liner amplifier, and outputs a detection result to said signal conversion means, and said signal conversion means adjusts said signal generation parameter so that said DC level inputted by said DC level detection means is virtually equal to zero.

An amplification control method of the present invention comprises of the steps of: generating a digital signal and an analog signal from an input signal that is an amplification target based on a signal generation parameter, amplifying said digital signal by a switching amplifier, amplifying said analog signal by a linear amplifier, detecting DC level of at least one of a signal which is amplified or has been amplified by said liner amplifier, and adjusting said signal generation parameter so that said DC level is virtually equal to zero.

Advantageous Effects of Invention

By using the present invention, amplification with low distortion and high efficiency can be achieved.

DESCRIPTION OF EXEMPLARY EMBODIMENT

Figure 1:
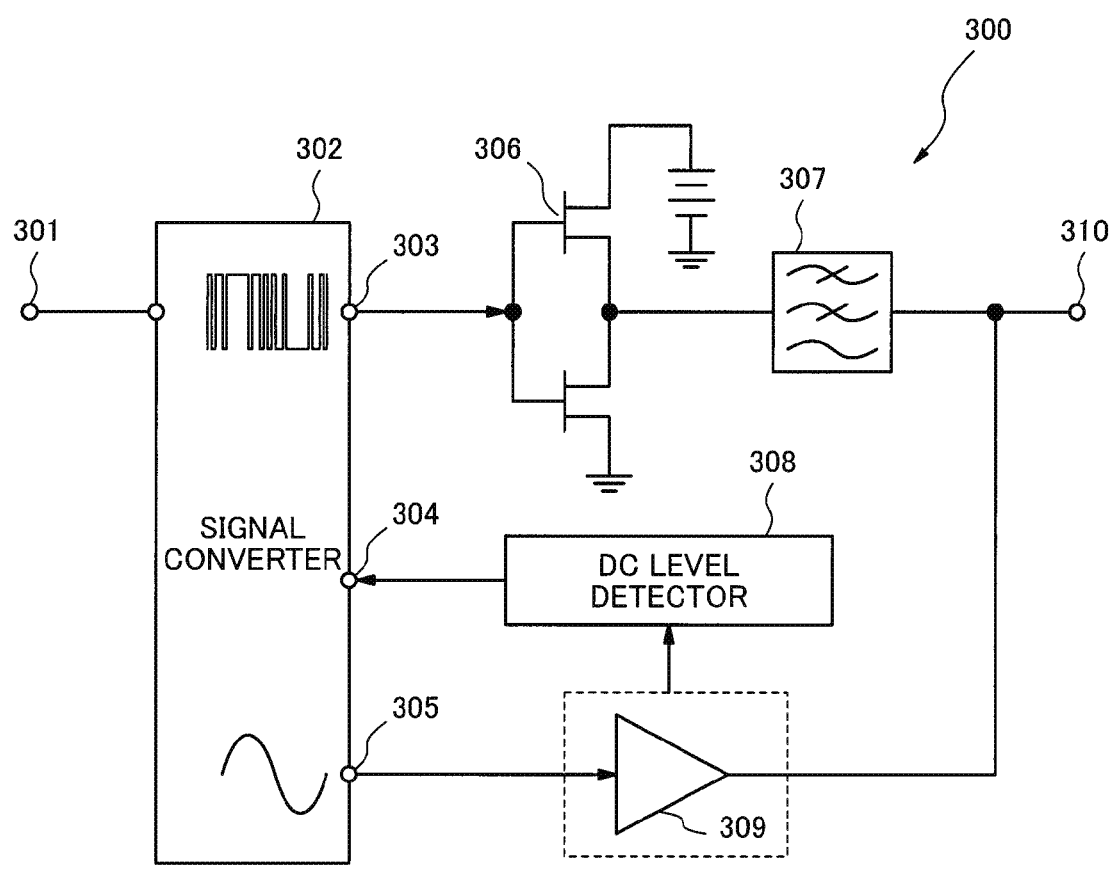
FIG. 1 is a block diagram showing an example of a configuration of a power amplifier according to a first exemplary embodiment of the present invention.

An exemplary embodiment of the present invention will be described below in detail with reference to the drawing.

[First Exemplary Embodiment]

FIG. 1 is a block diagram showing an example of a configuration of a power amplifier 300 according to a first exemplary embodiment of the present invention. The power amplifier 300 comprises a signal input terminal 301, a signal converter 302 (signal conversion block), a digital signal output terminal 303, a DC (Direct Current) feedback terminal 304, and an analog signal output terminal 305. Further, the power amplifier 300 comprises a switching amplifier 306, a low pass filter 307, a DC level detector 308 (DC level detection block), a linear amplifier 309, and a signal output terminal 310.

A signal that is an amplification target is inputted through the signal input terminal 301. The signal converter 302 generates a digital signal amplified by the switching amplifier 306 and an analog signal amplified by the linear amplifier 309 from the signal inputted through the signal input terminal 301 based on a predetermined signal generation parameter. In this operation, the signal converter 302 adjusts the above-mentioned signal generation parameter so that a DC level (a result of the detection performed by the DC level detector 308) of at least one of a signal amplified by the linear amplifier 309 and the amplified signal is virtually equal to zero (of course, the value virtually equal to zero includes a value really equal to zero). The signal converter 302 inputs information about the above-mentioned DC level from the DC level detector 308 through the DC feedback terminal 304. Here, in this exemplary embodiment, the DC level is detected to detect a gain error of the switching amplifier 306 and the linear amplifier 309. The gain difference between the switching amplifier 306 and the linear amplifier 309 is reflected in the DC level. The reason that the DC level is detected for obtaining the information is because the DC level can be relatively easily detected.

A state in which the DC level is equal to zero is a state in which no gain error occurs. Further, in this exemplary embodiment and a second to fourth exemplary embodiments described later, the DC level state includes not only a state in which the level is completely equal to zero but also a state in which the level is virtually equal to zero (namely, a signal having a sufficiently low frequency in the vicinity of DC is included).

The digital signal is outputted to the switching amplifier 306 through the digital signal output terminal 303. The analog signal is outputted to the linear amplifier 309 through the analog signal output terminal 305. The switching amplifier 306 amplifies the digital signal inputted through the digital signal output terminal 303. A signal having a frequency higher than a specific threshold value in the amplified digital signal (for example, high-frequency noise) is eliminated by the low pass filter 307. The linear amplifier 309 amplifies the analog signal inputted through the analog signal output terminal 305. In this operation, the DC level detector 308 detects the DC level of at least one of the signal amplified by the linear amplifier 309 and the amplified signal, and outputs it to the DC feedback terminal 304. The signal outputted by the low pass filter 307 is combined with the signal outputted by the linear amplifier 309 and the combined signal is outputted through the signal output terminal 310.

First, the signal amplified by the switching amplifier 306 and the signal amplified by the linear amplifier 309 are simultaneously generated by the signal converter 302. The phase difference between the output signal of the switching amplifier 306 and the output signal of the linear amplifier 309 is corrected by adjusting the timings at which the digital signal and the analog signal are outputted by the signal converter 302. As a result, an influence of the operation delay which occurs when the switching amplifier 306 and the linear amplifier 309 amplify the input signal can be eliminated.

Next, the DC level detector 308 measures the DC level of at least one of the signal amplified by the linear amplifier 309 and the amplified signal. By this operation, the DC level detector 308 detects the gain error of the switching amplifier 306 and the linear amplifier 309 and feeds back the detected error to the signal converter 302. The signal converter 302 corrects the generation parameter of the signal amplified by the switching amplifier 306 and the generation parameter of the signal amplified by the linear amplifier 309. As a result, the gain error of the switching amplifier 306 and the linear amplifier 309 can be corrected.

Namely, by using the first exemplary embodiment described above, because the error on the operation of the switching amplifier 306 and the linear amplifier 309 can be corrected, the power amplifier with high efficiency and low distortion can be realized.

Further, it is not necessary to perform the above-mentioned error correction in real time and the correction can be performed intermittently. For example, when the amplifier is used for amplifying an amplitude modulation signal of a WCDMA (Wideband Code Division Multiple Access) signal, an operation in which the error is detected and the generation parameter of the signal converter is refreshed may be performed every 10 milliseconds that corresponds to one frame. Because the feedback is not performed in real time, an undesirable oscillation caused by the phase delay of the feedback loop scarcely occurs and a wideband amplifier can be easily realized.

Further, in FIG. 1, the low pass filter 307 is not essential and the output signal of the switching amplifier 306 can be combined with the output signal of the linear amplifier 309 directly.

[Second Exemplary Embodiment]

Figure 2:
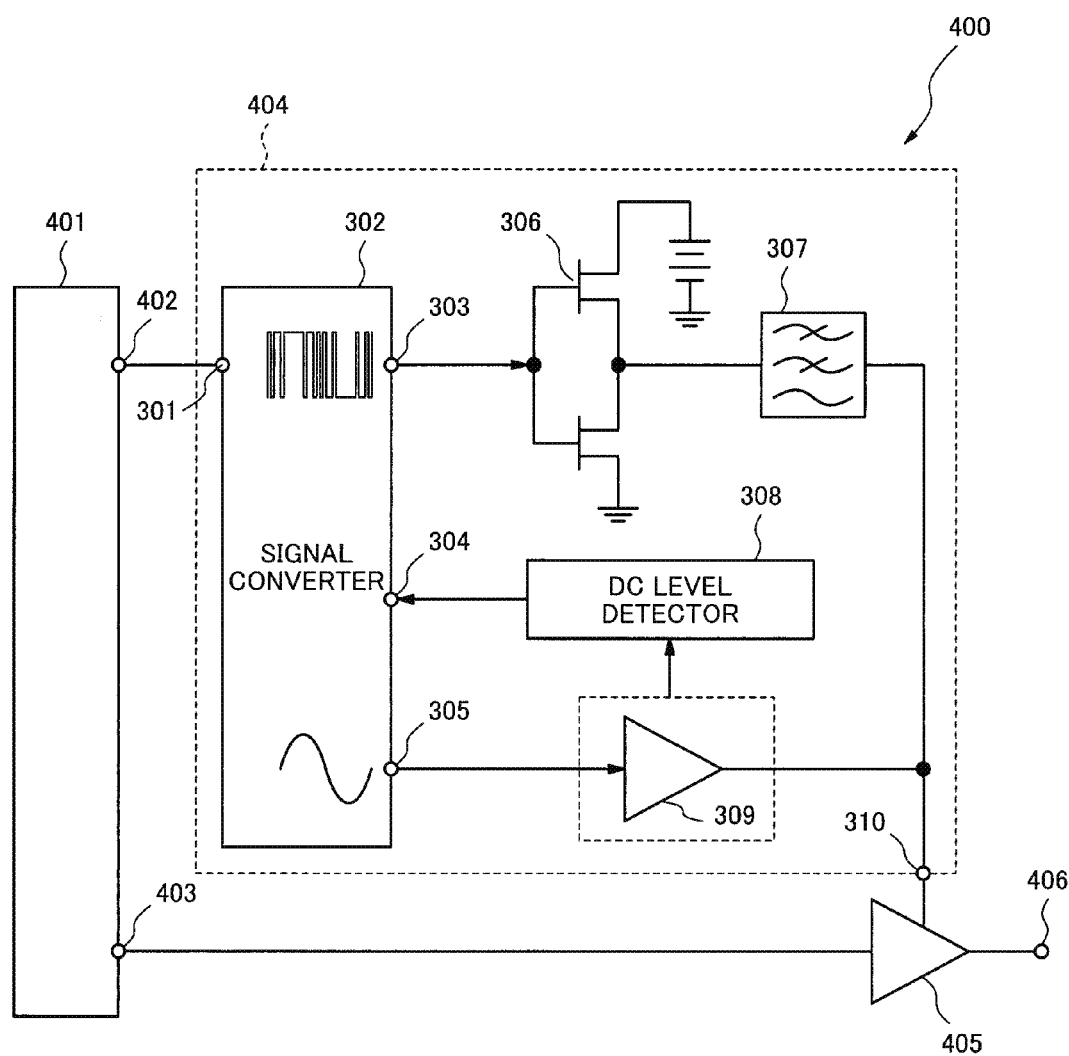
FIG. 2 is a block diagram showing an example of a configuration of a radio-frequency power amplification device according to a second exemplary embodiment of the present invention.

FIG. 2 is a block diagram showing an example of a configuration of a radio-frequency power amplification device 400 according to a second exemplary embodiment of the present invention. The radio-frequency power amplification device 400 comprises a baseband signal conversion circuit 401, an amplitude signal output terminal 402, a first radio-frequency modulation signal output terminal 403, a second radio-frequency modulation signal output terminal 406, a power supply modulator 404, and a radio-frequency power amplifier 405. The configuration of the power supply modulator 404 is the same as that of the power amplifier 300 of the first exemplary embodiment.

The baseband signal conversion circuit 401 outputs a radio-frequency modulation signal obtained by converting a baseband signal through the first radio-frequency modulation signal output terminal 403 and outputs the amplitude modulation component of the radio-frequency modulation signal through the amplitude signal output terminal 402. The amplitude signal output terminal 402 is connected to the signal input terminal 301 of the power supply modulator 404. The power supply modulator 404 amplifies the input signal and outputs the amplified signal through the signal output terminal 310. The signal outputted through the signal output terminal 310 is supplied as the power supply of the radio-frequency power amplifier 405. The signal outputted through the first radio-frequency modulation signal output terminal 403 is inputted to the radio-frequency power amplifier 405. The radio-frequency power amplifier 405 amplifies the signal inputted through the first radio-frequency modulation signal output terminal 403 and outputs the amplified signal to the second radio-frequency modulation signal output terminal 406.

In the second exemplary embodiment described above, the power amplifier 300 of the first exemplary embodiment is used as the power supply modulator of the radio-frequency power amplifier 405. Accordingly, the radio-frequency power amplifier 405 can perform the amplification with low distortion and high efficiency.

Further, in the second exemplary embodiment, the radio-frequency modulation signal outputted through the first radio-frequency modulation signal output terminal 403 may be a signal in which the amplitude modulation component is eliminated. In this case, the input signal has to be adjusted so that the radio-frequency power amplifier 405 always operates in a saturation mode. When such adjustment is performed, a signal that is a product of the signal supplied through the first radio-frequency modulation signal output terminal 403 and the signal supplied by the power supply modulator 404 as the power supply is outputted by the radio-frequency power amplifier 405.

[Third Exemplary Embodiment]

Figure 3:
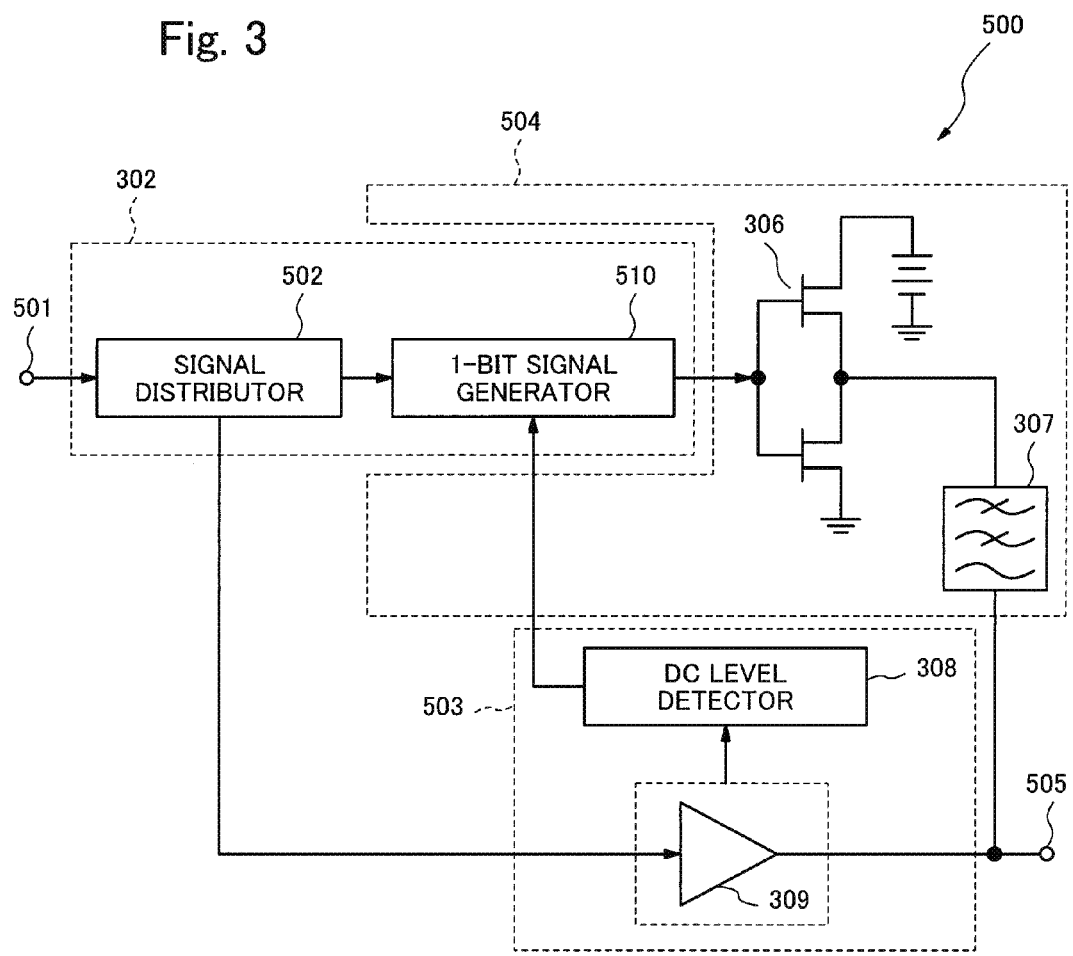
FIG. 3 is a block diagram showing an example of a configuration of a power amplifier according to a third exemplary embodiment of the present invention.

FIG. 3 is a block diagram showing an example of a configuration of a power amplifier 500 according to a third exemplary embodiment of the present invention. The power amplifier 500 comprises a signal input terminal 501, the signal converter 302, a linear amplifier module 503, a switching amplifier module 504, and a signal output terminal 505.

The input signal that is the amplification target is inputted through the signal input terminal 501. The signal converter 302 comprises a signal distributor 502 (signal distribution block) and a 1-bit signal generator 510. The signal distributor 502 divides the input signal into two signals (a first signal and a second signal). After that, after the signal distributor 502 adjusts an amount of relative delay between two divided signals and a signal band, the signal distributor 502 outputs one signal (first signal) to the switching amplifier module 504 and outputs the other signal (second signal) to the linear amplifier module 503. The 1-bit signal generator 510 generates a 1-bit signal from the first signal.

The linear amplifier module 503 comprises the DC level detector 308 (DC level detection block) and the linear amplifier 309. The linear amplifier 309 amplifies the second signal inputted by the signal distributor 502 and outputs the amplified signal. The DC level detector 308 detects the DC level of at least one of a signal amplified by the linear amplifier 309 and the amplified signal, and supplies the detected DC level to the 1-bit signal generator 510 as a control signal.

The switching amplifier module 504 comprises the switching amplifier 306 and the low pass filter 307. The switching amplifier 306 amplifies the 1 bit signal outputted by the 1-bit signal generator 510. The signal having a frequency higher than a specific threshold value (for example, high-frequency noise) in the amplified 1-bit signal is eliminated by the low pass filter 307. The signal outputted by the low pass filter 307 is combined with the signal outputted by the linear amplifier module 503 and the combined signal is outputted through the signal output terminal 505.

When the 1-bit signal generator 510 generates the 1-bit signal from the first signal, it adjusts the signal generation parameter related to the 1-bit signal generation based on the control signal (DC level) supplied by the DC level detector 308. Specifically, the 1-bit signal generator 510 adjusts the signal generation parameter so that the DC level is virtually equal to zero.

Further, in the above-mentioned explanation, a case in which the 1-bit signal generator 510 is included in the signal converter 302 is taken as an example. However, the configuration is not limited to this. For example, the 1-bit signal generator 510 may be included in the switching amplifier module 504.

Configuration of the signal distributor 502, the linear amplifier module 503, and the switching amplifier module 504 will be described in detail below.

First, the configuration of the signal distributor 502 will be described. The signal distributor 502 adjusts the amount of relative delay between the signal outputted to the linear amplifier module 503 and the signal outputted to the switching amplifier module 504, and the signal band. For example, a signal distributor 502A (refer to FIG. 4) or a signal distributor 502B (refer to FIG. 5) described later can be used as the signal distributor 502.

Figure 4:
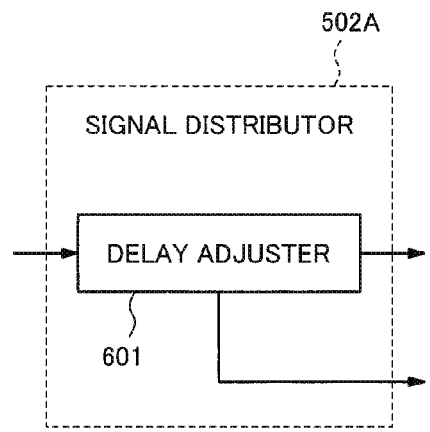
FIG. 4 is a block diagram showing an example of a first configuration of a signal distributor which can be incorporated in a power amplifier shown in FIG. 3.

FIG. 4 is a block diagram showing an example of a configuration of the signal distributor 502A which can be incorporated in the power amplifier 500 shown in FIG. 3. The signal distributor 502A is a signal distributor which adjusts only the amount of relative delay between the first signal and the second signal. The signal distributor 502A comprises a delay adjuster 601. The delay adjuster 601 divides the input signal into two signals (the first signal and the second signal) and adjusts the amount of relative delay between two divided signals. The first signal in two signals of which the amount of relative delay therebetween is adjusted is outputted to the switching amplifier module 504 and the second signal in them is outputted to the linear amplifier module 503.

The amount of relative delay adjusted by the delay adjuster 601 is determined as follows. Namely, the amount of relative delay is determined so that a phase difference produced by the relative difference between the transmission delay generated when the signal is amplified by the linear amplifier module 503 and the transmission delay generated when the signal is amplified by the switching amplifier module 504 is virtually equal to zero. Here, the value virtually equal to zero includes a value really equal to zero.

Figure 5:
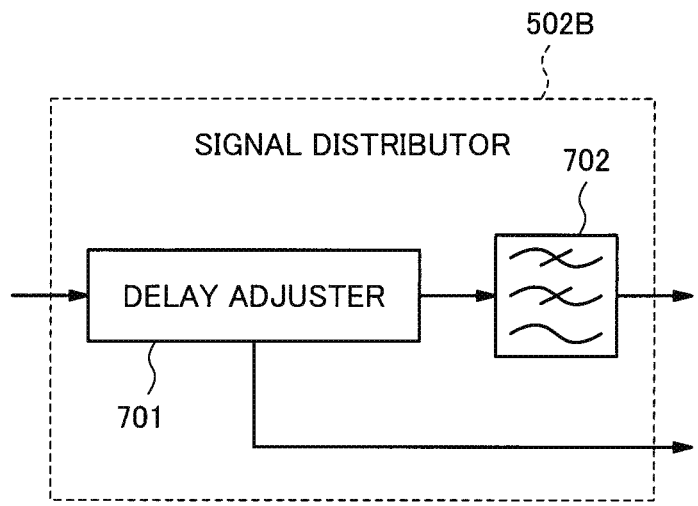
FIG. 5 is a block diagram showing an example of a second configuration of a signal distributor which can be incorporated in a power amplifier shown in FIG. 3.

FIG. 5 is a block diagram showing an example of a configuration of the signal distributor 502B which can be incorporated in the power amplifier 500 shown in FIG. 3. The signal distributor 502B is a signal distributor which adjusts the amount of relative delay between the first signal outputted to the switching amplifier module 504 and the second signal outputted to the linear amplifier module 503, and further adjusts the signal band. The signal distributor 502B comprises a delay adjuster 701 and a low pass filter 702. The delay adjuster 701 divides the input signal into two signals (the first signal and the second signal) and adjusts the amount of the relative delay between two divided signals. The first signal in two signals of which the amount of relative delay therebetween is adjusted is outputted to the switching amplifier module 504 through the low pass filter 702 and the second signal in them is outputted to the linear amplifier module 503. The low pass filter 702 adjusts the signal band. Specifically, the low pass filter 702 eliminates the frequency signal having a frequency higher than a specific threshold value in the signal. It is said that generally, the power efficiency of the switching amplifier decreases when the switching amplifier operates at high speed. Accordingly, in order to operate the switching amplifier at low speed, the signal having a low frequency is used for the signal inputted to the switching amplifier module 504. By this means, decrease in power efficiency can be prevented.

The amount of relative delay adjusted by the delay adjuster 701 is determined so that the phase difference caused by the following operation becomes virtually equal to zero. The phase difference arises from the difference of the amounts of relative delay between the transmission delay generated when the linear amplifier module 503 amplifies the signal and the transmission delay generated when the switching amplifier module 504 amplifies the signal passing through the low pass filter 702. Here, the value virtually equal to zero includes a value really equal to zero.

Next, the configuration of the linear amplifier module 503 will be described. For example, a linear amplifier module 503A (refer to FIG. 6), a linear amplifier module 503B (refer to FIG. 7), or a linear amplifier module 503C (refer to FIG. 8) described below can be used as the linear amplifier module 503.

Figure 6:
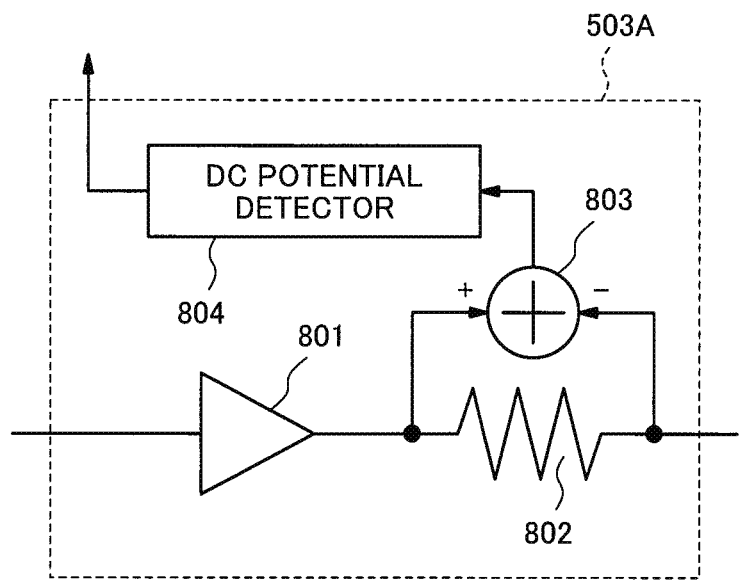
FIG. 6 is a block diagram showing an example of a first configuration of a linear amplifier module which can be incorporated in a power amplifier shown in FIG. 3.

FIG. 6 is a block diagram showing an example of the configuration of the linear amplifier module 503A which can be incorporated in the power amplifier 500 shown in FIG. 3. The linear amplifier module 503A comprises a linear amplifier 801, a current sensing resistor 802, a subtractor 803, and a DC potential detector 804 (DC level detection block).

The linear amplifier 801 amplifies the second signal supplied by the signal distributor 502 and outputs the amplified signal to the signal output terminal 505 through the current sensing resistor 802.

The subtractor 803 detects an electric potential difference between the node at which the linear amplifier 801 and the current sensing resistor 802 are connected to each other and the node at which the current sensing resistor 802 and the signal output terminal 505 are connected to each other, and outputs the electric potential difference to the DC potential detector 804.

The DC potential detector 804 detects the DC potential (DC level) from the electric potential difference inputted by the subtractor 803 and outputs the DC potential to the 1-bit signal generator 510 (refer to FIG. 3) as a control signal. The 1-bit signal generator 510 adjusts the signal generation parameter so that this DC potential is virtually equal to zero (of course, the value virtually equal to zero includes a value really equal to zero).

Figure 7:
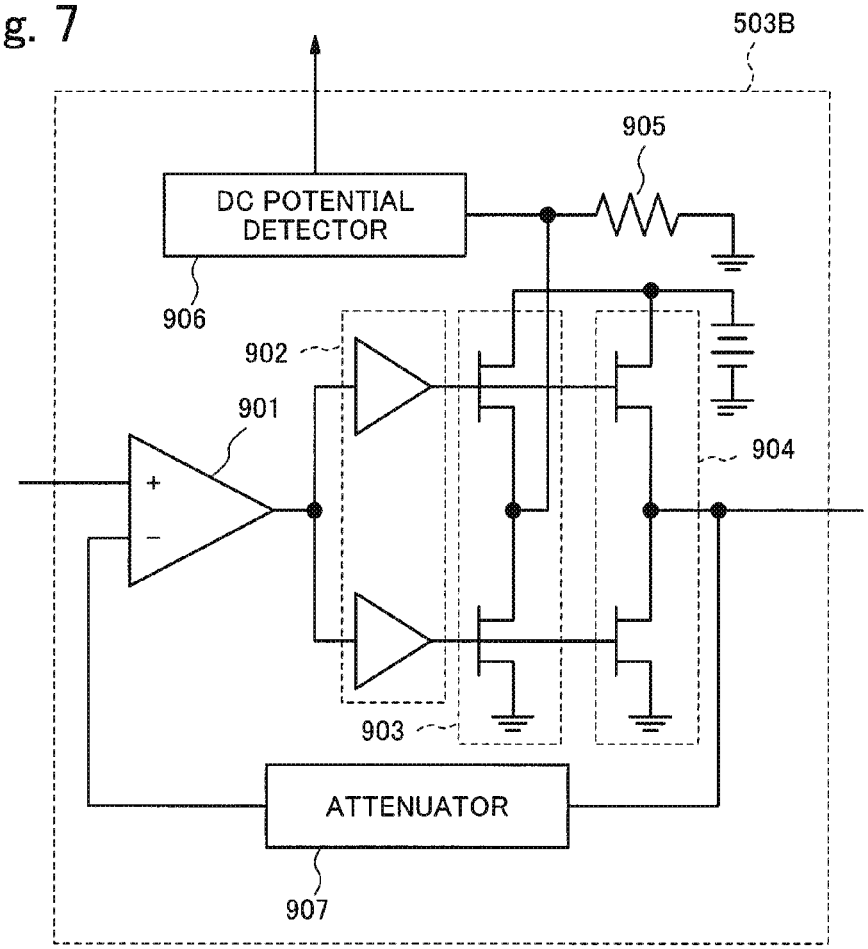
FIG. 7 is a block diagram showing an example of a second configuration of a linear amplifier module which can be incorporated in a power amplifier shown in FIG. 3.

FIG. 7 is a block diagram showing an example of the configuration of the linear amplifier module 503B which can be incorporated in the power amplifier 500 shown in FIG. 3. The linear amplifier module 503B comprises an operational amplifier 901, a buffer stage circuit 902, a current mirror circuit 903, an output stage circuit 904, a current sensing resistor 905, a DC potential detector 906 (DC level detection block), and an attenuator 907.

The operational amplifier 901 amplifies a value obtained by subtracting the feedback signal supplied through the attenuator 907 from the second signal supplied by the signal distributor 502, and outputs the amplified value to the buffer stage circuit 902.

The buffer stage circuit 902 amplifies the signal inputted by the operational amplifier 901 and outputs the amplified signal to the current mirror circuit 903 and the output stage circuit 904. Further, the buffer stage circuit 902 functions as a gate bias circuit of the current mirror circuit 903 and the output stage circuit 904.

The output stage circuit 904 amplifies the signal inputted by the buffer stage circuit 902 and outputs the amplified signal to the signal output terminal 505.

The attenuator 907 attenuates the output signal of the output stage circuit 904 and supplies the attenuated signal to the operational amplifier 901 as the feedback signal.

The current mirror circuit 903 acts as the current mirror of the output stage circuit 904. Accordingly, the ratio of the output current of the current mirror circuit 903 to the output current of the output stage circuit 904 is always constant.

The current sensing resistor 905 detects the output current of the current mirror circuit 903 and converts the detected output current into a voltage.

The DC potential detector 906 detects the DC component (DC level) of the output signal of the current mirror circuit 903 that is converted into the voltage by the current sensing resistor 905, and outputs the detected DC component to the 1-bit signal generator 510 (refer to FIG. 3) as the control signal. The 1-bit signal generator 510 adjusts the signal generation parameter so that this DC component is virtually equal to zero (of course, the value virtually equal to zero includes a value really equal to zero).

Figure 8:
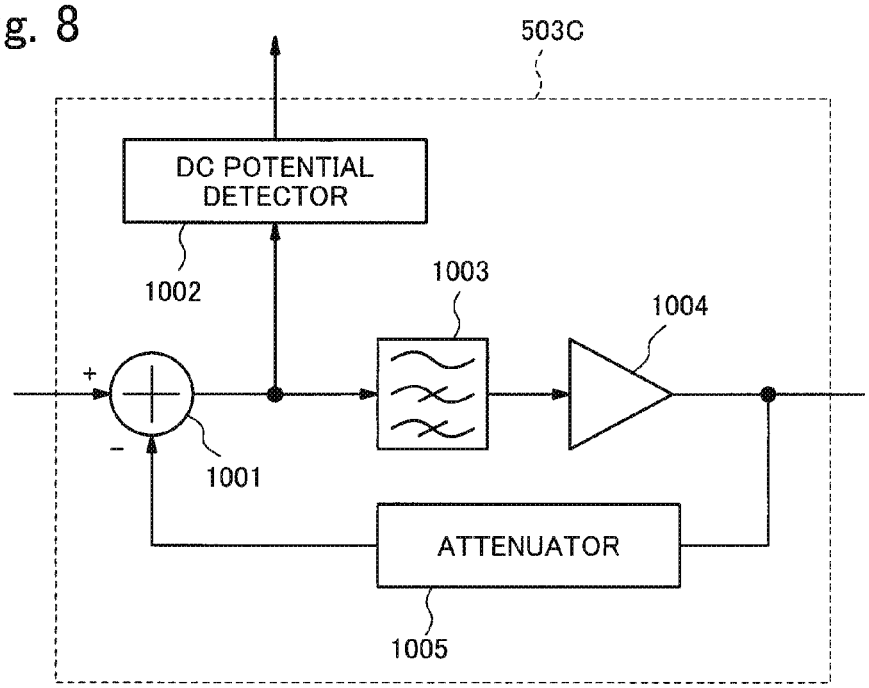
FIG. 8 is a block diagram showing an example of a third configuration of a linear amplifier module which can be incorporated in a power amplifier shown in FIG. 3.

FIG. 8 is a block diagram showing an example of the configuration of the linear amplifier module 503C which can be incorporated in the power amplifier 500 shown in FIG. 3. The linear amplifier module 503C comprises a subtractor 1001, a DC potential detector 1002 (DC level detection block), a high pass filter 1003, a linear amplifier 1004, and an attenuator 1005.

The subtractor 1001 outputs a signal obtained by subtracting the feedback signal supplied through the attenuator 1005 from the second signal supplied by the signal distributor 502.

The DC potential detector 1002 detects the DC component (DC level) of the output signal of the subtractor 1001 and outputs the detected DC component to the 1-bit signal generator 510 (refer to FIG. 3) as the control signal. The 1-bit signal generator 510 adjusts the signal generation parameter so that this DC component is virtually equal to zero (of course, the value virtually equal to zero includes a value really equal to zero).

The high pass filter 1003 eliminates a low frequency component from the output signal of the subtractor 1001 and outputs the filtered output signal to the linear amplifier 1004.

The linear amplifier 1004 amplifies the output signal of the high pass filter 1003 and outputs the amplified output signal to the signal output terminal 505.

The attenuator 1005 attenuates the output signal of the linear amplifier 1004 and supplies the attenuated output signal to the subtractor 1001 as the feedback signal.

The switching amplifier module 504 has a function to change a parameter of the signal amplification by using the control signal supplied by the linear amplifier module 503.

Next, the configuration of the switching amplifier module 504 will be described. For example, a switching amplifier module 504A (refer to FIG. 9), a switching amplifier module 504B (refer to FIG. 10), or a switching amplifier module 504C (refer to FIG. 11) described below can be used as the switching amplifier module 504. Further, the switching amplifier modules 504A to 504C have the function of the 1-bit signal generator 510. Accordingly, these switching amplifier modules 504A to 504C receive the control signal (DC level) from the linear amplifier module 503 (for example, the above-mentioned linear amplifier modules 503A to 503C) and adjust the signal generation parameter related to the 1-bit signal generation.

Figure 9:
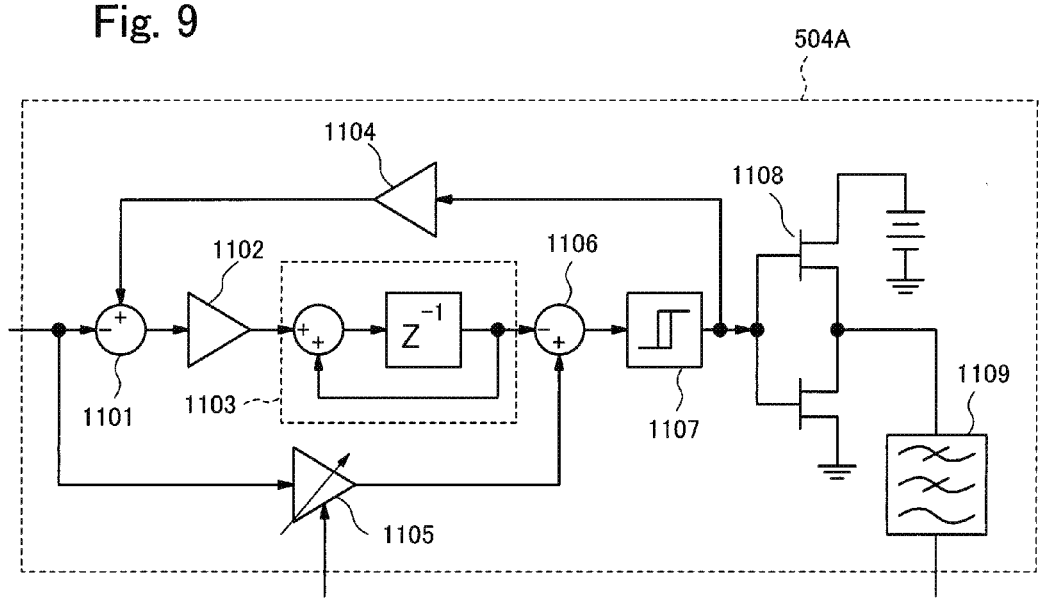
FIG. 9 is a block diagram showing an example of a first configuration of a switching amplifier module which can be incorporated in a power amplifier shown in FIG. 3.

FIG. 9 is a block diagram showing an example of the configuration of the switching amplifier module 504A which can be incorporated in the power amplifier 500 shown in FIG. 3. The switching amplifier module 504A comprises subtractors 1101 and 1106, fixed gain amplifiers 1102 and 1104, an integrator 1103, a variable gain amplifier 1105, a hysteresis comparator 1107, a switching amplifier 1108, and a low pass filter 1109.

The subtractor 1101 outputs a signal obtained by subtracting the first signal outputted by the signal distributor 502 from the output signal of the fixed gain amplifier 1104 to the fixed gain amplifier 1102.

The fixed gain amplifier 1102 amplifies the output signal of the subtractor 1101 and outputs the amplified output signal to the integrator 1103.

The integrator 1103 performs a time integration of the output signal of the fixed gain amplifier 1102 and outputs the integrated value to the subtractor 1106.

The variable gain amplifier 1105 amplifies the first signal supplied by the signal distributor 502 and outputs the amplified first signal to the subtractor 1106. Here, the gain of the variable gain amplifier 1105 is determined based on the control signal supplied by the linear amplifier module 503.

The subtractor 1106 outputs a value obtained by subtracting the output signal of the integrator 1103 from the output signal of the variable gain amplifier 1105 to the hysteresis comparator 1107.

The hysteresis comparator 1107 makes a sign determination of the input signal and outputs the sign. However, the hysteresis comparator 1107 has a function to hold the latest output state and has a hysteresis width (V_hys). In the hysteresis comparator 1107, when the latest output state is "Low", the output state changes to "High" when the input signal level becomes equal to or greater than V_hys/2 and when the latest output state is "High", the output state changes to "Low" when the input signal level becomes equal to or smaller than −V_hys/2.

The fixed gain amplifier 1104 amplifies the output signal of the hysteresis comparator 1107 and outputs the amplified output signal to the subtractor 1101.

The switching amplifier 1108 amplifies the output signal of the hysteresis comparator 1107 and outputs the amplified signal to the output terminal 505 through the low pass filter 1109.

Figure 10:
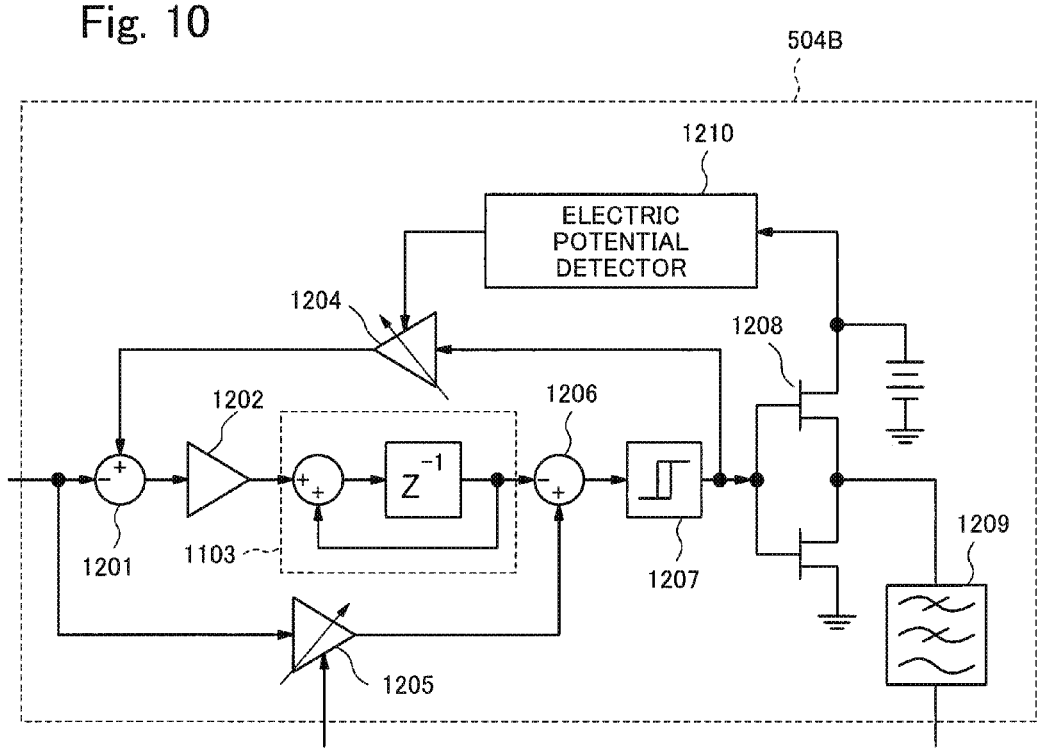
FIG. 10 is a block diagram showing an example of a second configuration of a switching amplifier module which can be incorporated in a power amplifier shown in FIG. 3.

FIG. 10 is a block diagram showing an example of the configuration of the switching amplifier module 504B which can be incorporated in the power amplifier 500 shown in FIG. 3. The switching amplifier module 504B comprises subtractors 1201 and 1206, a fixed gain amplifier 1202, an integrator 1203, and variable gain amplifiers 1204 and 1205. Further, the switching amplifier module 504B comprises a hysteresis comparator 1207, a switching amplifier 1208, a low pass filter 1209, and an electric potential detector 1210.

The subtractor 1201 outputs a signal obtained by subtracting the first signal outputted by the signal distributor 502 from the output signal of the variable gain amplifier 1204 to the fixed gain amplifier 1202.

The fixed gain amplifier 1202 amplifies the output signal of the subtractor 1201 and outputs the amplified signal to the integrator 1203.

The integrator 1203 performs the time integration of the output signal of the fixed gain amplifier 1202 and outputs the integrated value to the subtractor 1206.

The variable gain amplifier 1205 amplifies the first signal supplied by the signal distributor 502 and outputs the amplified signal to the subtractor 1206. Here, the gain of the variable gain amplifier 1205 is determined based on the control signal supplied by the linear amplifier module 503.

The subtractor 1206 outputs a value obtained by subtracting the output signal of the integrator 1203 from the output signal of the variable gain amplifier 1205 to the hysteresis comparator 1207.

The hysteresis comparator 1207 makes a sign determination of the input signal and outputs the sign. However, the hysteresis comparator 1207 has a function to hold the latest output state and has a hysteresis width (V_hys). In the hysteresis comparator 1207, when the latest output state is "Low", the output state changes to "High" when the input signal level becomes equal to or greater than V_hys/2 and when the latest output state is "High", the output state changes to "Low" when the input signal level becomes equal to or smaller than −V_hys/2.

The switching amplifier 1208 amplifies the output signal of the hysteresis comparator 1207 and outputs the amplified signal to the signal output terminal 505 through the low pass filter 1209.

The electric potential detector 1210 measures the power supply voltage of the switching amplifier 1208 and outputs the control signal based on the measured voltage to the variable gain amplifier 1204.

The variable gain amplifier 1204 amplifies the output signal of the hysteresis comparator 1207 and outputs the amplified signal to the subtractor 1201. Here, the gain of the variable gain amplifier 1204 is determined based on the control signal supplied by the electric potential detector 1210.

Figure 11:
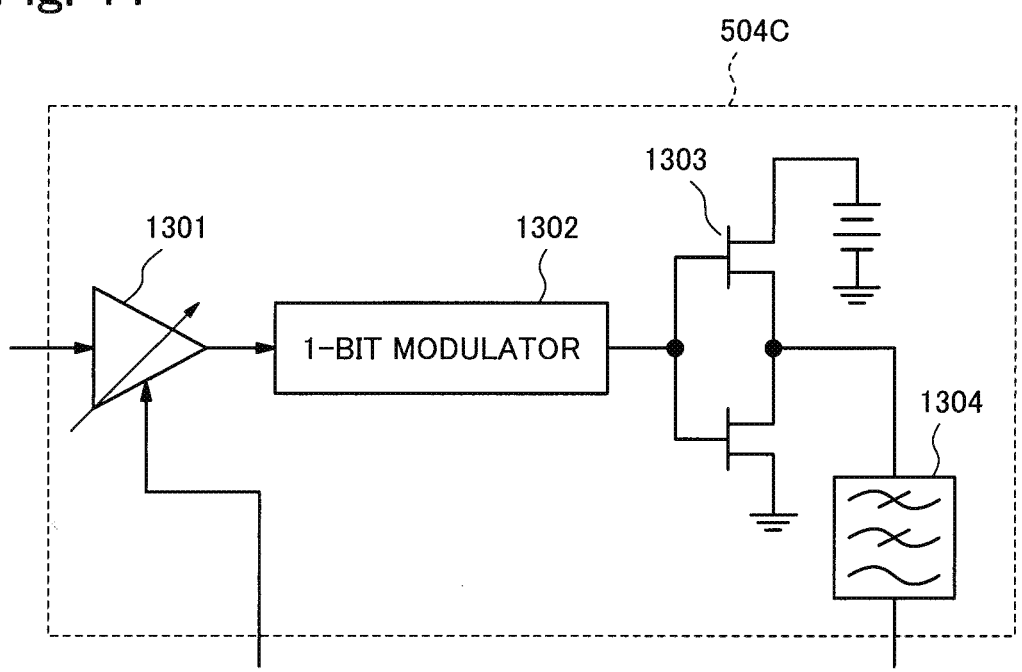
FIG. 11 is a block diagram showing an example of a third configuration of a switching amplifier module which can be incorporated in a power amplifier shown in FIG. 3.

FIG. 11 is a block diagram showing an example of the configuration of the switching amplifier module 504C which can be incorporated in the power amplifier 500 shown in FIG. 3. The switching amplifier module 504C comprises a variable gain amplifier 1301, a 1-bit modulator 1302, a switching amplifier 1303, and a low pass filter 1304.

The variable gain amplifier 1301 amplifies the first signal supplied by the signal distributor 502 and outputs the amplified signal to the 1-bit modulator 1302. Here, the gain of the variable gain amplifier 1301 is determined based on the control signal supplied by the linear amplifier module 503.

The 1-bit modulator 1302 converts the output signal of the variable gain amplifier 1301 into a 1-bit signal, and outputs the 1-bit signal to the switching amplifier 1303. Here, a delta sigma modulator, a PWM (Pulse Width Modulation) modulator, or the like is envisaged as a 1-bit modulator 1302.

The switching amplifier 1303 amplifies the output signal of the 1-bit modulator 1302 and outputs the amplified signal to the signal output terminal 505 through the low pass filter 1304.

The power amplifier 500 of the third exemplary embodiment described above can correct the operation error of the switching amplifier and the linear amplifier like the power amplifier 300 of the first exemplary embodiment. Therefore, the power amplifier 500 can be used as a power amplifier with high efficiency and low distortion.

Further, in the power amplifier 500 of the third exemplary embodiment, the amount of relative delay between the signal outputted to the switching amplifier and the signal outputted to the linear amplifier and the signal band are adjusted in addition to the correction of the gain error of the switching amplifier and the linear amplifier. Accordingly, it is possible to further certainly prevent the decrease in efficiency caused by the operation error of the switching amplifier and the linear amplifier.

Further, in FIG. 3, the low pass filter 307 is not essential and the output of the switching amplifier 306 can be combined with the output of the linear amplifier 309 directly.

[Fourth Exemplary Embodiment]

Figure 12:
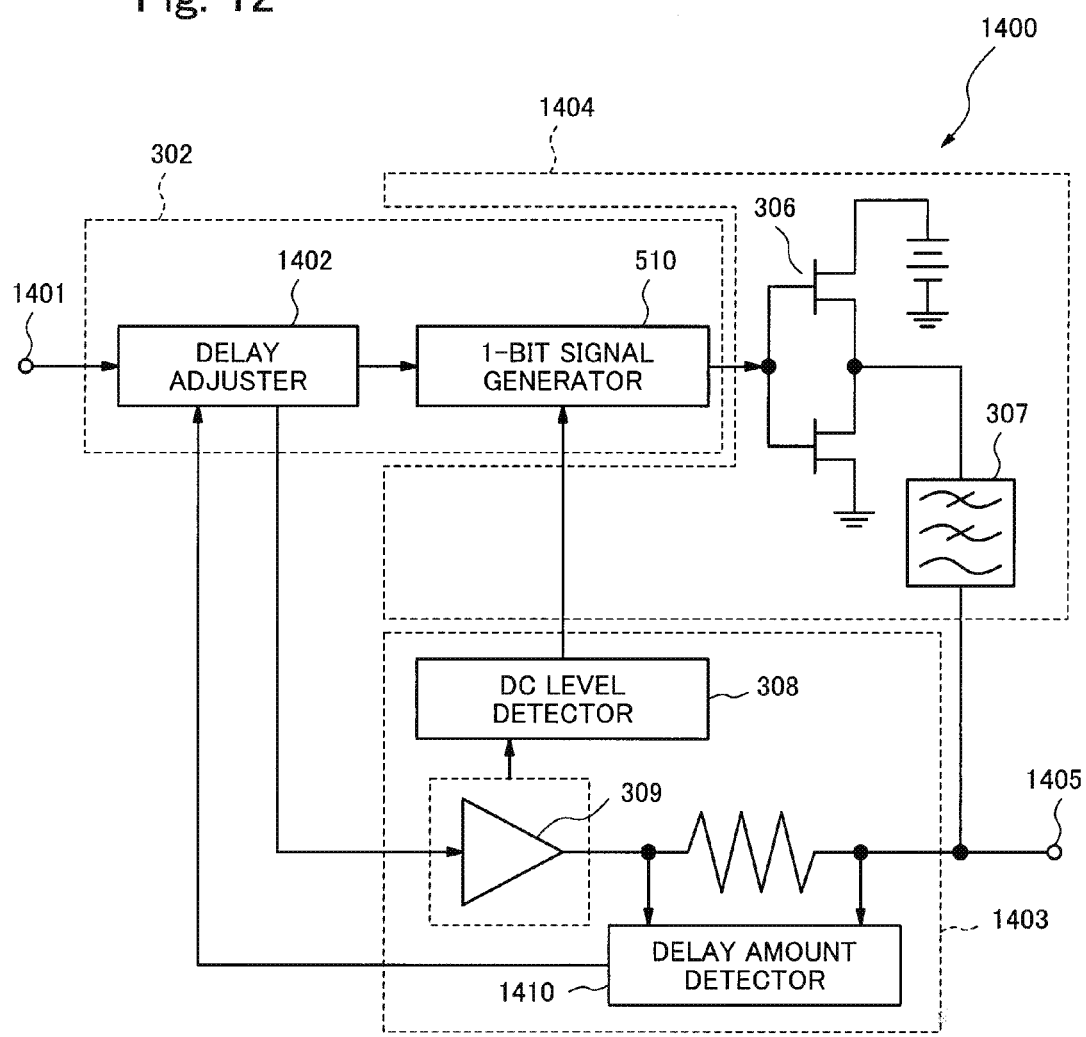
FIG. 12 is a block diagram showing an example of a configuration of a power amplifier according to a fourth exemplary embodiment of the present invention.

FIG. 12 is a block diagram showing an example of a configuration of a power amplifier 1400 according to a fourth exemplary embodiment of the present invention. The power amplifier 1400 comprises a signal input terminal 1401, a signal converter 302, a linear amplifier module 1403, a switching amplifier module 1404, and a signal output terminal 1405.

The signal that is the amplification target is inputted through the signal input terminal 1401. The signal converter 302 comprises a delay adjuster 1402 (signal distribution block) and the 1-bit signal generator 510. The delay adjuster 1402 divides the input signal into two signals (the first signal and the second signal) and adjusts the amount of relative delay between two divided signals.

The first signal in two signals of which the amount of relative delay therebetween is adjusted is outputted to the switching amplifier module 1404 and the second signal in them is outputted to the linear amplifier module 1403.

Further, the amount of relative delay adjusted by the delay adjuster 1402 is determined so that a phase difference between the output signal of the linear amplifier module 1403 and the output signal of the switching amplifier module 1404 is virtually equal to zero (of course, the value virtually equal to zero includes the value really equal to zero). Information on the phase difference between the output signal of the linear amplifier module 1403 and the output signal of the switching amplifier module 1404 is given by the linear amplifier module 1403 as the second control signal (phase difference information).

The linear amplifier module 1403 comprises the DC level detector 308 (DC level detection block), the linear amplifier 309, and a delay amount detector 1419. The linear amplifier 309 amplifies the second signal inputted by the delay adjuster 1402 and outputs the amplified signal. The DC level detector 308 detects the DC level of at least one of the signal amplified by the linear amplifier 309 and the amplified signal and supplies the detected DC level to the 1-bit signal generator 510 as the first control signal (DC level information). A delay amount detector 1410 detects the phase difference between the output signal of the linear amplifier module 1403 and the output signal of the switching amplifier module 1404 and outputs it to the delay adjuster 1402 as the second control signal.

The switching amplifier module 1404 comprises the switching amplifier 306 and the low pass filter 307. The switching amplifier 306 amplifies the 1-bit signal inputted by the 1-bit signal generator 510. The signal having a frequency higher than a specific threshold value (for example, high-frequency noise) in the amplified 1-bit signal is eliminated by the low pass filter 307. The signal outputted by the low pass filter 307 is combined with the signal outputted by the linear amplifier module 1403 and the combined signal is outputted through the signal output terminal 505.

Further, in the fourth exemplary embodiment, for example, the switching amplifier module 504A (refer to FIG. 9), the switching amplifier module 504B (refer to FIG. 10), or the switching amplifier module 504C (refer to FIG. 11) that is used for the third exemplary embodiment can be used as the switching amplifier module 1404.

For example, a linear amplifier module 1403A (refer to FIG. 13) or a linear amplifier module 1403B (refer to FIG. 14) that is described below can be used as the linear amplifier module 1403.

Figure 13:
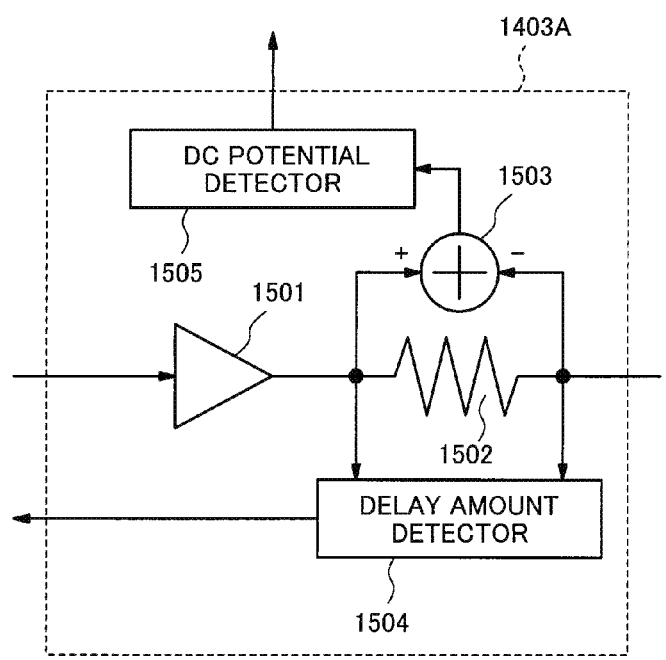
FIG. 13 is a block diagram showing an example of a first configuration of a linear amplifier module which can be incorporated in a power amplifier shown in FIG. 12.

FIG. 13 is a block diagram showing an example of the configuration of the linear amplifier module 1403A which can be incorporated in the power amplifier 1400 shown in FIG. 12. The linear amplifier module 1403A comprises a linear amplifier 1501, a current sensing resistor 1502, a subtractor 1503, a delay amount detector 1504, and a DC potential detector 1505 (DC level detection block).

The linear amplifier 1501 amplifies the second signal supplied by the delay adjuster 1402 and outputs the amplified signal to the signal output terminal 1405 through the current sensing resistor 1502.

The subtractor 1503 detects an electric potential difference between the node at which the linear amplifier 1501 and the current sensing resistor 1502 are connected to each other and the node at which the current sensing resistor 1502 and the signal output terminal 1405 are connected to each other and outputs the detected electric potential difference to the DC potential detector 1505.

The DC potential detector 1505 detects the DC potential (DC level) from the electric potential difference inputted by the subtractor 1503 and outputs the detected DC potential to the 1-bit signal generator 510 (refer to FIG. 12) as the first control signal. The 1-bit signal generator 510 adjusts the signal generation parameter so that this DC potential is virtually equal to zero (of course, the value virtually equal to zero includes a value really equal to zero). Here, when the switching amplifier module 1404 has a function of the 1-bit signal generator 510 (for example, the switching amplifier module shown in FIG. 9 to FIG. 11), the first control signal is outputted to the switching amplifier module 1404.

The delay amount detector 1504 detects the phase difference between the waveform of the node at which the linear amplifier 1501 and the current sensing resistor 1502 are connected to each other and the waveform of the node at which the current sensing resistor 1502 and signal output terminal 1405 are connected to each other, and outputs the detected phase difference to the delay adjuster 1402 as the second control signal.

Figure 14:
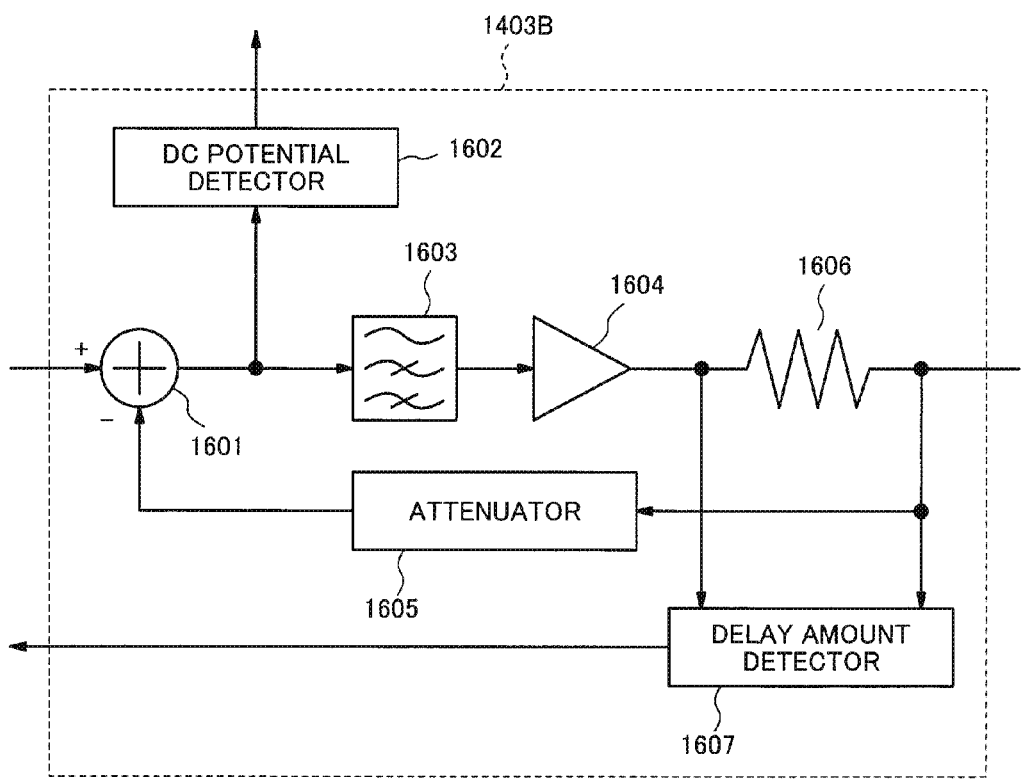
FIG. 14 is a block diagram showing an example of a second configuration of a linear amplifier module which can be incorporated in a power amplifier shown in FIG. 12.
Figure 15:
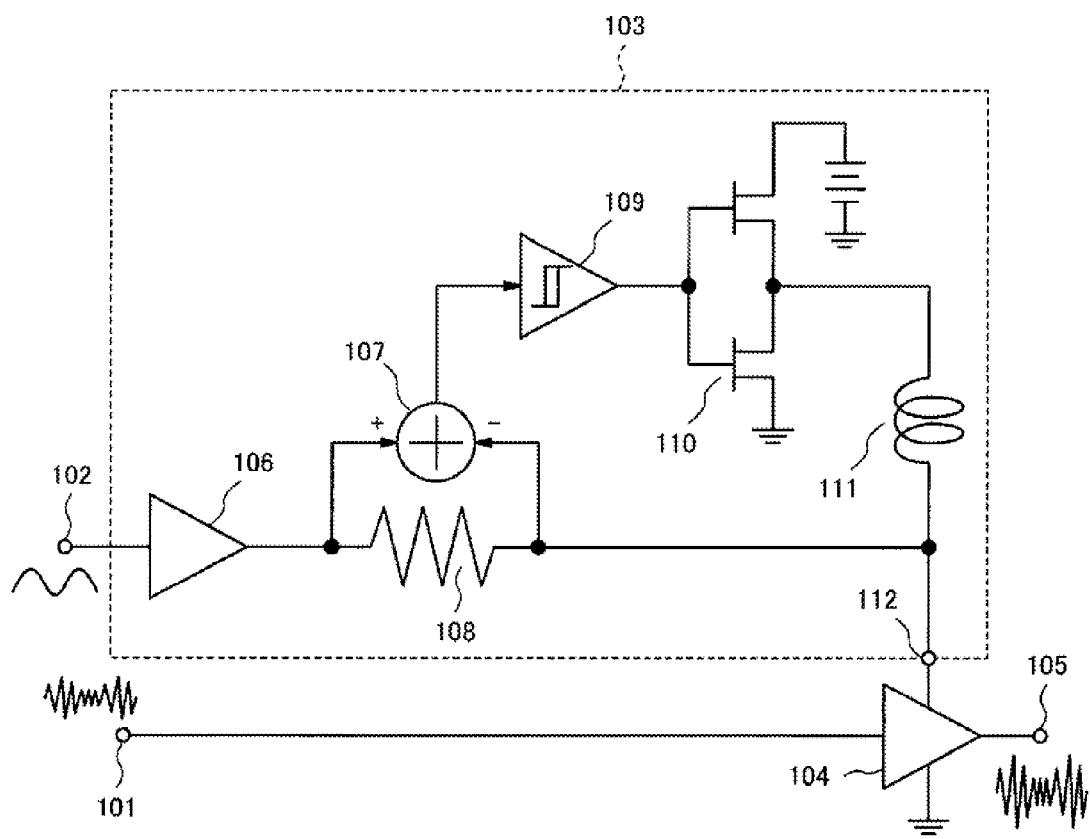
FIG. 15 is a configuration diagram of a radio-frequency power amplifier (polar modulation power amplifier) described in non-patent document 1.
Figure 16:
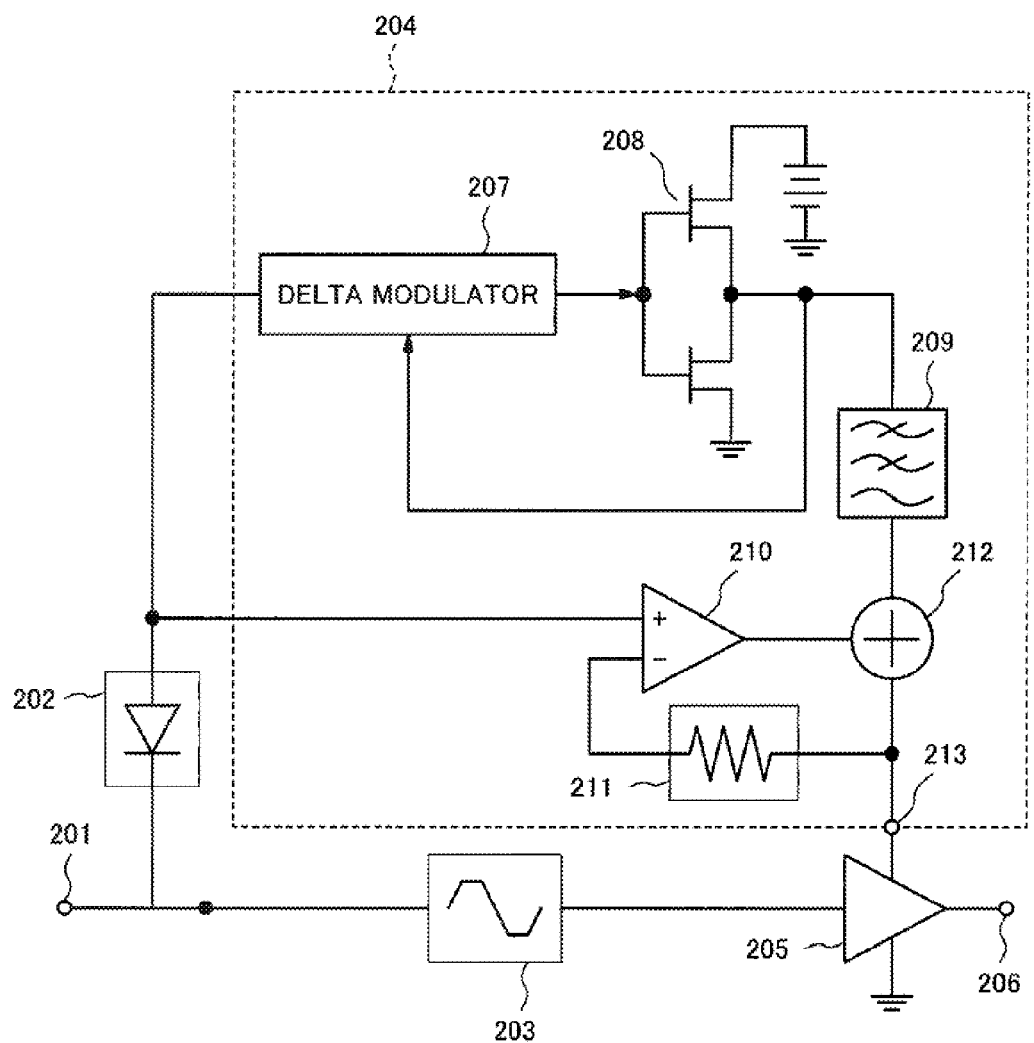
FIG. 16 is a configuration diagram of a radio-frequency power amplifier described in patent document 1.

FIG. 14 is a block diagram showing an example of the configuration of the linear amplifier module 1403B which can be incorporated in the power amplifier 1400 shown in FIG. 12. The linear amplifier module 1403B comprises a subtractor 1601, a DC potential detector 1602 (DC level detection block), a high pass filter 1603, a linear amplifier 1604, an attenuator 1605, a resistor 1606, and a delay amount detector 1607.

The subtractor 1601 outputs a signal obtained by subtracting the feedback signal supplied through the attenuator 1605 from the second signal supplied by the delay adjuster 1402.

The DC potential detector 1602 detects the DC component of the output signal of the subtractor 1601 and outputs the detected DC component to the 1-bit signal generator 510 as the first control signal. The 1-bit signal generator 510 adjusts the signal generation parameter so that this DC potential is virtually equal to zero (of course, the value virtually equal to zero includes a value really equal to zero). Here, when the switching amplifier module 1404 has the function of the 1-bit signal generator 510 (for example, the switching amplifier module shown in FIG. 9 to FIG. 11), the first control signal is outputted to the switching amplifier module 1404.

The high pass filter 1603 eliminates a low frequency component from the output signal of the subtractor 1601 and outputs it to the linear amplifier 1604. The linear amplifier 1604 amplifies the output signal of the high pass filter 1603 and outputs the amplified signal to the signal output terminal 1405 through a resistor 1606.

The attenuator 1605 attenuates the signal of the node at which the resistance 1606 and the signal output terminal 1405 are connected to each other, and supplies the attenuated signal to the subtractor 1601 as the feedback signal.

The delay amount detector 1607 detects a phase difference between the waveform of the node at which the linear amplifier 1604 and the resistor 1606 are connected to each other and the waveform of the node at which the resistance 1606 and the signal output terminal 1405 are connected to each other, and outputs the detected phase difference to the delay adjuster 1402 as the second control signal.

The power amplifier 1400 of the fourth exemplary embodiment described above can correct the operation error of the switching amplifier and the linear amplifier like the power amplifier 300 of the first exemplary embodiment. Therefore, the power amplifier 1400 can be used as a power amplifier with high efficiency and low distortion.

Further, in the fourth exemplary embodiment, like the third exemplary embodiment, the amount of relative delay between the signals outputted to the switching amplifier and the linear amplifier and the signal band are adjusted in addition to the correction of the gain error of the both amplifier. Accordingly, it is possible to further certainly prevent the decrease in efficiency caused by the operation error of the switching amplifier and the linear amplifier.

Further, in the fourth exemplary embodiment, the amount of the relative delay between the signals outputted to the both amplifiers is determined based on the phase difference between the output signals of the both amplifiers. Accordingly, the adjustment with high accuracy can be performed according to an actual environment. As a result, the more efficient amplification process can be achieved.

Further, in FIG. 12, the low pass filter 307 is not essential and the output of the switching amplifier 306 can be combined with the output of the linear amplifier 309 directly.

Further, as with the power amplifier 300 of the first exemplary embodiment, the power amplifier 500 of the third exemplary embodiment and the power amplifier 1400 of the fourth exemplary embodiment can be used as the power supply circuit for the radio-frequency power amplifier like the power supply modulator 404 of the second exemplary embodiment.

Each of the exemplary embodiments described above can be combined with the other exemplary embodiment.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application claims priority based on Japanese Patent Application No. 2010-225567 filed on Oct. 5, 2010, the disclosure of which is hereby incorporated by reference in its entirety.

INDUSTRIAL APPLICABILITY

The present invention relates to a power amplifier, a radio-frequency power amplification device, and an amplification control method and has industrial applicability.

REFERENCE SIGN LIST

300, 500, 1400 power amplifier
302 signal converter
306 switching amplifier
307 low pass filter
308 DC level detector
309 linear amplifier
400 radio-frequency power amplification device
401 baseband signal conversion circuit
404 power supply modulator
405 radio-frequency power amplifier
502, 502A, 502B signal distributor
503, 503A, 503B 503C, 1403, 1403A, 1403B linear amplifier module
504, 504A, 504B 504C, 1404 switching amplifier module
510 1-bit signal generator
601, 701, 1402 delay adjuster
804, 906, 1002, 1505, 1602 DC potential detector
902 buffer stage circuit
903 current mirror circuit
904 output stage circuit
1003, 1603 high pass filter
1102, 1104, 1202 fixed gain amplifier
1103, 1203 integrator
1105, 1204, 1205, 1301 variable gain amplifier
1210 electric potential detector
1302 1-bit modulator
1410, 1504, 1607 delay amount detector
1606 resistor

What is claimed is:

1. A power amplifier comprising;
   a signal distribution unit which divides an input signal that is an amplification target into a first signal and a second signal;
   a switching amplifier module which generates a digital signal from said first signal and amplifies said digital signal;
   a linear amplifier module which amplifies said second signal, detects a DC level of said amplified second signal, and outputs a first detection result to said switching amplifier module as DC level information; and
   a signal output terminal which outputs a combined signal of said amplified digital signal and said amplified second signal;
   wherein said switching amplifier module adjusts a signal generation parameter related to the generation of said digital signal so that said DC level is substantially equal to zero.

2. The power amplifier according to claim 1, wherein said signal distribution unit adjusts an amount of relative delay between said first signal and said second signal.

3. The power amplifier according to claim 2, wherein the adjustment of said amount of relative delay between said first signal and said second signal is an adjustment by which a first phase difference between a first output signal of said linear amplifier module and a second output signal of said switching amplifier module is made substantially equal to zero.

4. The power amplifier according to claim 1, wherein said linear amplifier module comprises:
   a linear amplifier which amplifies said second signal;
   a resistor including a first terminal and a second terminal, the first terminal being connected to an output of said linear amplifier and the second terminal being connected to said signal output terminal;
   a subtractor which detects an electric potential difference between the first terminal and the second terminal; and
   a DC potential detector which detects a DC potential from the electric potential difference, and outputs the detected DC potential to said switching amplifier module as the DC level information.

5. The power amplifier according to claim 1, wherein said linear amplifier module comprises:

an operational amplifier which amplifies an electric potential difference between said second signal and a feedback signal;
a buffer amplifier which amplifies an output signal of said operational amplifier;
an output stage circuit which amplifies an output signal of said buffer amplifier;
an attenuator which attenuates an output signal of said output stage circuit and generates said feedback signal;
a current mirror circuit which inputs an output signal of said buffer amplifier and generates an output current similar to an output current of said output stage circuit;
a resistor which converts the output current of said current mirror circuit into a voltage; and
a DC potential detector which detects a DC potential from the converted voltage, and outputs the detected DC potential to said switching amplifier module as the DC level information.

6. The power amplifier according to claim 1, wherein said linear amplifier module comprises:
a subtractor which outputs an electric potential difference between said second signal and a feedback signal;
a high pass filter which eliminates a low frequency component from an output signal of said subtractor;
a linear amplifier which amplifies an output signal of said high pass filter;
an attenuator which attenuates an output signal of said linear amplifier and generates said feedback signal; and
a DC potential detector which detects a DC potential from an output signal of said subtractor and outputs the detected DC potential to said switching amplifier module as the DC level information.

7. The power amplifier according to claim 3, wherein said first phase difference is detected by said linear amplifier module, said detected first phase difference is transmitted to said signal distribution unit as phase difference information, and said signal distribution unit adjusts said amount of relative delay based on said phase difference information.

8. The power amplifier according to claim 7, wherein said linear amplifier module comprises:
a linear amplifier which amplifies said second signal;
a resistor including a first terminal and a second terminal, the first terminal being connected to an output of said linear amplifier and the second terminal being connected to said signal output terminal;
a subtractor which detects an electric potential difference between the first terminal and the second terminal;
a DC potential detector which detects a DC potential from the electric potential difference and outputs the detected DC potential to said switching amplifier module as the DC level information; and
a delay amount detector which detects a second phase difference between a third signal at the first terminal of the resistor and a fourth signal at the second terminal of the resistor and outputs the detected second phase difference to said signal distribution unit as the phase difference information.

9. The power amplifier according to claim 7, wherein said linear amplifier module comprises:
a subtractor which outputs an electric potential difference between said second signal and a feedback signal;
a high pass filter which eliminates a low frequency component from an output signal of said subtractor;
a linear amplifier which amplifies an output signal of the high pass filter and outputs an amplified output signal;
a resistor including a first terminal and a second terminal, the first terminal being connected to an output of the linear amplifier and a third signal is outputted from the second terminal;
an attenuator which attenuates the third signal and generates said feedback signal;
a DC potential detector which detects a DC potential from the electric potential difference, and outputs the detected DC potential to said switching amplifier module as the DC level information; and
a delay amount detector which detects a second phase difference between a fourth signal at the first terminal of the resistor and the third signal at the second terminal of the resistor and outputs the detected second phase difference to said signal distribution unit as the phase difference information.

10. The power amplifier according to claim 1, wherein said switching amplifier module comprises:
a first subtractor which outputs a third signal obtained by subtracting said first signal from a feedback signal;
a first fixed gain amplifier which amplifies the third signal;
an integrator which performs a time integration of an output signal of said first fixed gain amplifier;
a variable gain amplifier which amplifies said first signal based on a gain determined based on said DC level information;
a second subtractor which outputs a fourth signal obtained by subtracting an output signal of said integrator from an output signal of said variable gain amplifier;
a hysteresis comparator which has an arbitrary hysteresis width Vhys, inputs the fourth signal, outputs a Low-state signal when a current state is "High" and an electric potential of the input signal is decreased by a value smaller than or equal to −(Vhys/2), and outputs a High-state signal when the current state is "Low" and the electric potential of the input signal is increased by a value equal to or greater than +(Vhys/2);
a second fixed gain amplifier which amplifies an output signal of said hysteresis comparator, and outputs an amplified output signal to said first subtractor as said feedback signal;
a switching amplifier which performs power amplification of the output signal of said hysteresis comparator; and
a low pass filter which eliminates a high-frequency component from an output signal of the switching amplifier, and outputs a filtered signal.

11. The power amplifier according to claim 1, wherein said switching amplifier module comprises:
a first subtractor which outputs a third signal obtained by subtracting said first signal outputted by said signal distribution unit from a first feedback signal;
a fixed gain amplifier which amplifies the third signal;
an integrator which performs a time integration of an output signal of said fixed gain amplifier;
a first variable gain amplifier which amplifies said first signal based on a gain determined based on said DC level information;
a second subtractor which outputs a fourth signal obtained by subtracting an output signal of said integrator from an output signal of said first variable gain amplifier;
a hysteresis comparator which has an arbitrary hysteresis width Vhys, inputs the fourth signal, outputs a Low-state signal when a current state is "High" and an electric potential of the input signal is decreased by a value smaller than or equal to −(Vhys/2), and outputs a High-state signal when the current state is "Low" and the electric potential of the input signal is increased by a value equal to or greater than +(Vhys/2);

a second variable gain amplifier which amplifies an output signal of said hysteresis comparator with a gain determined on the basis of a second feedback signal, and outputs an amplified output signal to said first subtractor as said first feedback signal;

a switching amplifier which performs power amplification of an output signal of said hysteresis comparator;

an electric potential detector which monitors a power supply voltage of said switching amplifier and generates said second feedback signal according to a value of the power supply voltage; and a low pass filter which eliminates a high-frequency component from an output signal of said switching amplifier, and outputs a filtered signal.

12. The power amplifier according to claim 1, wherein said switching amplifier module comprises:

a variable gain amplifier which amplifies said first signal based on a gain determined based on said DC level information;

a 1-bit modulator which converts an output signal of said variable gain amplifier into a 1-bit modulation signal;

a switching amplifier which performs power amplification of an output signal of said 1-bit modulator; and a low pass filter which eliminates a high-frequency component from an output signal of said switching amplifier, and outputs a filtered signal.

13. The power amplifier according to claim 1, wherein said signal distribution unit adjusts a band of said first signal.

14. The power amplifier according to claim 13, wherein said adjustment of a band of said first signal is an adjustment by which a frequency signal having a frequency higher than a specific threshold value is eliminated by a low pass filter.

15. A radio-frequency power amplifier comprising;

a baseband signal conversion circuit which generates a radio-frequency modulation signal and an amplitude modulation signal;

a radio-frequency power amplifier which amplifies said radio-frequency modulation signal; and a power supply modulator which inputs said amplitude modulation signal as an input signal and supplies an output signal as a power supply for said radio-frequency power amplifier; wherein said power supply modulator comprises a signal conversion unit which generates a digital signal and an analog signal from the input signal that is an amplification target based on a signal generation parameter;

a switching amplifier which amplifies said digital signal;

a linear amplifier which amplifies said analog signal; and a DC level detector which detects a DC level of an analog signal which has been amplified by said linear amplifier, and outputs a detection result to said signal conversion unit; and said signal conversion unit adjusts said signal generation parameter so that said DC level inputted is substantially equal to zero.

16. An amplification control method comprising:

dividing an input signal that is an amplification target into a first signal and a second signal;

generating a digital signal from said first signal and amplifying said digital signal;

amplifying said second signal;

detecting a DC level of said amplified second signal;

outputting a result of the detection as DC level information; and outputting a combined signal of said amplified digital signal and said amplified second signal, wherein a signal generation parameter related to the generation of said digital signal is adjusted so that said DC level is substantially equal to zero.

* * * * *